(12) United States Patent
North et al.

(10) Patent No.: US 6,629,855 B1
(45) Date of Patent: *Oct. 7, 2003

(54) MEMORY SYSTEM INCLUDING GUIDES THAT RECEIVE MEMORY MODULES

(75) Inventors: David C. North, Santa Clara, CA (US); F. Demick Boyden, Union City, CA (US)

(73) Assignee: Silicon Graphics, Inc., Mountain View, CA (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/346,638

(22) Filed: Jul. 1, 1999

(51) Int. Cl.[7] .............................................. H01R 13/62
(52) U.S. Cl. ...................................... 439/325; 439/327
(58) Field of Search ................................. 439/325, 327, 439/328, 329, 64, 152, 153, 154, 155, 156, 157, 631, 632, 633, 634, 635, 636, 637

(56) References Cited

U.S. PATENT DOCUMENTS 3,216,580 A  * 11/1965  Fricker ........................ 211/41
3,932,016 A  *  1/1976  Ammenheuser .............. 339/65
4,349,237 A  *  9/1982  Cobaugh et al. .............. 339/65
4,991,062 A  *  2/1991  Nguyenngoc ................ 361/424
5,242,312 A  *  9/1993  Tondreault ................... 439/328
5,317,480 A  *  5/1994  Chandraiah et al. ......... 361/785
5,957,708 A  *  9/1999  Lin ............................. 439/157
6,246,585 B1 *  6/2001  Gunther et al. ............. 361/759

* cited by examiner

Primary Examiner—Alexander Gilman (57) ABSTRACT

A memory system is disclosed that includes memory modules that are longer and taller than conventional prior art memory modules. Each memory module includes two roughly L-shaped openings that extend from the top surface of the memory module near each side surface of the memory module. These L-shaped openings form tabs that extend horizontally along the top surface of the memory module. A guide assembly that includes sockets and guides is adapted to receive the memory module. Rotating latches that couple to each guide near the top of each guide engage a notch on each side surface of the memory module for facilitating insertion and removal. Rotation of each latch into a latched position engages a tab on the memory module so as to securely latch the memory module in place.

23 Claims, 6 Drawing Sheets

MEMORY SYSTEM INCLUDING GUIDES THAT RECEIVE MEMORY MODULES

TECHNICAL FIELD

The present invention relates to the field of computer systems. More particularly, the present invention relates to a computer system that includes a memory module and a memory module guide.

BACKGROUND ART

Computer systems typically include a motherboard on which a memory module receiving structure is mounted. The memory module receiving structure allows for memory modules to be coupled to the circuit board. This allows for flexible memory configuration by using memory modules having a desired configuration of memory components.

Many recent prior art memory systems use Dual Inline Memory Modules (DIMMs) aligned in parallel. Typically, each DIMM includes memory components that are Dynamic Random Access Memory (DRAM) semiconductor devices or Synchronous Dynamic Random Access Memory (SDRAM) devices. Each DIMM includes a memory card on which memory components are disposed. A card edge connector is formed by contact pads located on both sides of the bottom edge of the memory card.

Prior art memory module receiving structures typically include a connector receptacle, often referred to as a "socket" that is electrically coupled to the other electronic components on the motherboard. Individual DIMMs are installed by inserting the DIMM partially into the socket. A lever disposed on one side of the DIMM near the bottom side of the DIMM is pivoted by contact with the socket. When the DIMM is fully inserted, the lever latches in place. This provides positive feedback to the operator indicating that the DIMM is properly and fully inserted into the socket. The lever engages the socket so as to hold the DIMM securely in place. Extraction of the DIMM is accomplished by grasping the lever and pulling the lever downward. This pivots the lever so as to apply an upward force to the DIMM, moving the DIMM upward. The DIMM may then be removed.

Such prior art systems provide good electrical contact and allow for easy insertion and extraction of DIMMs. However, attempts to install or remove a DIMM can result in damage to the socket and/or to the connections to the socket printed on the motherboard. Such contact can tear the socket off the motherboard. This type of damage is common in systems that include densely packed motherboards and systems that do not allow easy access to all of the sockets.

Some prior art systems include card guides located on each side of the row of sockets. Each card guide includes slots that receive a side surface of a DIMM. When a card guide is located on each side of the receptacle, each DIMM is supported on both sides. This limits movement of individual DIMMs, decreasing the likelihood of damage to DIMMS, sockets and the motherboard resulting from contact during attempts to install or remove a DIMM or during attempts to install or remove a DIMM in an adjoining socket.

Prior art DIMM designs that include an ejection lever located on one side of the DIMM itself are expensive to manufacture. More particularly, the placement of the ejection lever on the DIMM complicates the manufacturing process of the DIMM and often results in manufacturing defects related to the assembly of the ejection lever to the memory card of the DIMM. Also, typically, the ejection lever is located near the bottom of the DIMM. This makes access to the ejection lever difficult.

Recently, the demand for more and more processing capacity and smaller sized computer housings has resulted in increases in component density on each motherboard. Also, many housing designs do not allow for easy access. Thus, access to the ejection lever has become more difficult.

Increased demand for memory capacity has lead to longer and taller DIMMs that can hold higher numbers of memory components. These longer and taller DIMMs make access to the ejection lever even more difficult. More particularly, the height of the DIMM makes it more difficult for a user to reach the ejection lever. The increased length of recent DIMMs adds to the component density problems on the motherboard, resulting in DIMMs being located close to other components. The increased component density further limits access to the ejection lever.

When longer and taller DIMMS are used, damage can result even in systems that include card guides. The increased height of the taller DIMM creates a greater moment when force is applied near the top of the DIMM. Thus, when a DIMM is contacted near the top of the DIMM, the force can result in both the card guide and the socket being torn off the circuit board. Also, when a longer DIMM is used, insertion of the DIMM requires the application of more force than is required for inserting a conventional DIMM module. The application of such force can result in damage to the DIMM and to the socket and to the motherboard itself.

What is needed is a system and apparatus that will allow for the use of longer and taller DIMMs. In addition, a system and apparatus is needed that meets the above need and that is less likely to be damaged. Also, a system and apparatus is needed that meets the above needs and that is inexpensive and easy to operate. Moreover, a system and apparatus is needed that includes DIMMs that are less expensive and that have lower defect rates during DIMM manufacturing processes. The present invention provides an elegant solution to the above needs.

DISCLOSURE OF THE INVENTION

The present invention provides a system and apparatus that allows for the use of longer and taller memory modules. The system and apparatus of the present invention is less likely to result in damage than prior art systems and is inexpensive and easy to operate. The present system includes memory modules that do not include levers mounted on the memory module itself. Thus, the memory module of the present invention is inexpensive to manufacture and defect rate during manufacturing is reduced.

A memory system is disclosed that includes memory modules that are longer and taller than conventional prior art DIMMs. Each memory module includes two openings that extend from the top surface of the memory module near each side surface of the memory module. These openings form tabs that extend horizontally along the top surface of the memory module. Notches are disposed in each side surface of the memory module. These notches are semicircular in shape and are located near the top surface of the memory module. The memory module also includes memory components and a card-edge connector. The card-edge connector is electrically coupled to the memory components and extends along the bottom of the memory module.

A guide assembly for a computer system is disclosed that includes sockets for receiving memory modules and guides located near each end of the sockets. Each guide includes slots that are adapted to receive memory modules. The guide assembly also includes latches that couple to each guide. The latches are coupled to the guides such that the latches rotate. Each latch includes a projection that extends from the latch such that, upon the insertion of memory modules into the slots, rotation of the latches results in application of force to the memory modules for facilitating insertion of the memory modules. More particularly, the projection that extends from the latch engages the notch on the side surface of the memory module for applying a downward force to the memory module. Rotation of each latch into a latched position engages a tab on the memory module with a slot extending along the bottom surface of each latch such that a surface of the latch engages the tab so as to securely latch the memory module in place.

Extraction of memory modules is facilitated by rotation of latches on opposite sides of a memory module. This applies an upward force to the memory module being removed, moving the memory module at least partially out of the socket. The memory module can then be easily removed by grasping the top of the memory module and pulling the memory module out from between the guides.

The present invention provides for easy insertion and extraction of memory modules and allows for the use of memory modules that are longer and taller than conventional prior art memory modules. Because the latches of the present invention are located near the top of each guide, latches are easily accessed. Therefore, there is no need to reach around each memory module as is required by prior art systems. Thus, damage to circuit boards, sockets, and memory modules that results from accidental contact during insertion and removal is avoided as compared to prior art systems.

The memory module of the present invention does not include an ejection lever mounted on the memory module itself as do prior art circuit boards. Thus, the memory modules of the present invention are less expensive to manufacture and result in lower manufacturing defect rates as compared to prior art memory modules that include levers mounted on the memory module itself. In addition, because the memory modules of the present invention do not include an ejection lever mounted on the DIMM itself as do prior art circuit boards, there is more available room on each memory module. This allows for higher density of memory components and higher memory capacity as compared to prior art circuit boards that include a lever mounted on the circuit board itself.

For the above reasons, the present invention provides a system and apparatus that allows for the use of longer and taller memory modules. The apparatus of the present invention is less likely to be damaged and is inexpensive and easy to operate. Moreover, the system and apparatus of the present invention provides for the manufacture of less expensive memory modules than prior art memory modules that include an ejection lever located on one side of the circuit card. In addition, the system and apparatus of the present invention provides for reduced defect rate during memory module manufacturing as compared to prior art memory modules that include an ejection lever located on one side of the circuit card.

These and other objects and advantages of the present invention will no doubt become obvious to those of ordinary skill in the art after having read the following detailed description of the preferred embodiments that are illustrated in the various drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Figure 1:
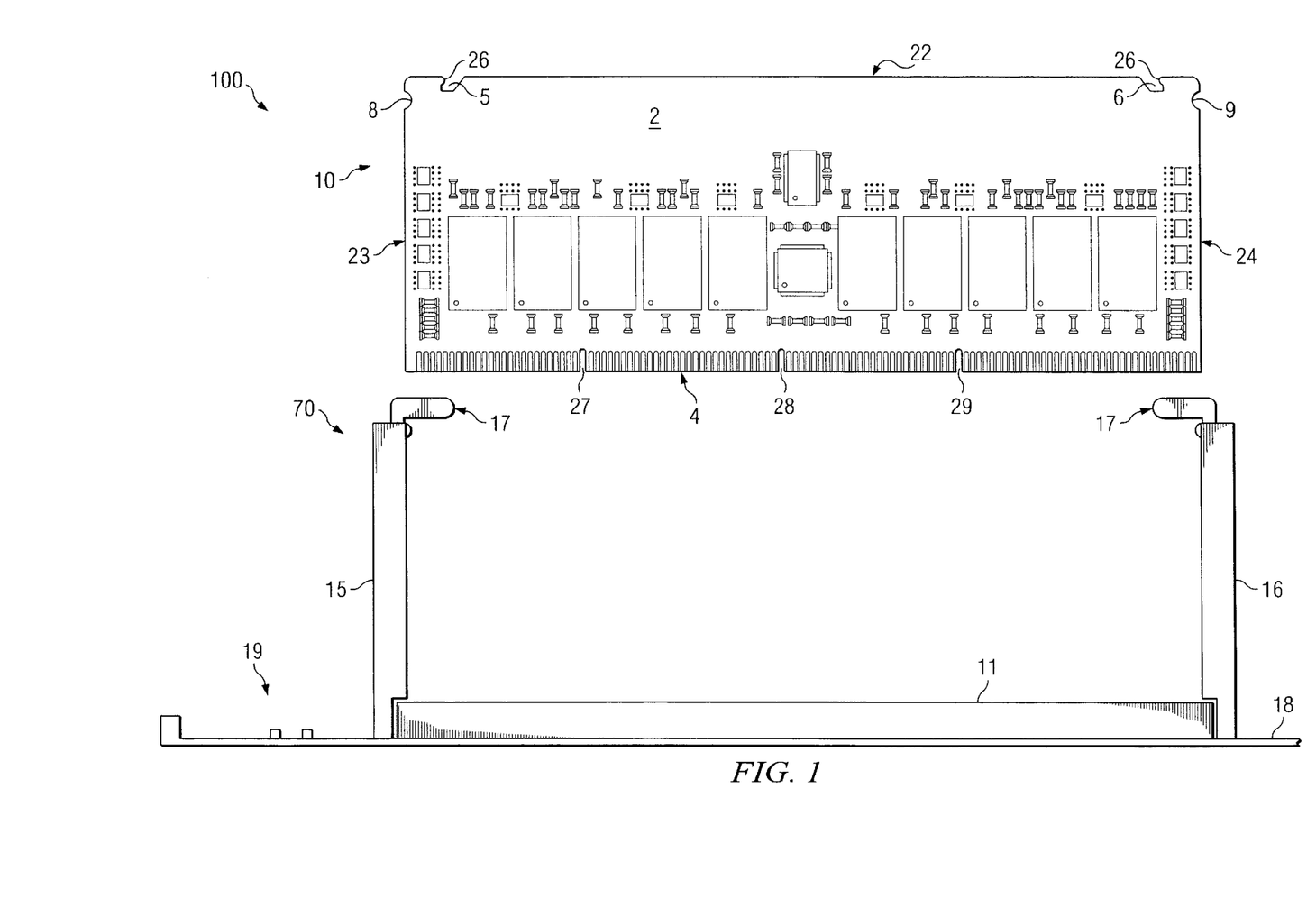
FIG. 1 is a diagram of a memory system showing a memory module and a circuit board on which a connector receptacle, guides and electronic circuitry are disposed in accordance with the present claimed invention.

Referring now to FIG. 1, memory system 100 is shown to include memory module 10 and guide assembly 70. Memory system 100 also includes circuit board 18 and electrical circuitry 19 that is disposed on circuit board 18. Memory system 100 further includes socket 11 that is disposed on circuit board 18 and is electrically coupled to electrical circuitry 17.

Continuing with FIG. 1, memory module 10 includes circuit card 2 and memory components 3. Memory components 3 are attached to circuit card 2 and are electrically connected to card edge connector 4 via conductive traces (not shown). In one embodiment, memory module 10 is a Dual Inline Memory Module (DIMM) and memory components 3 are Dynamic Random Access Memory (DRAM) devices. In one embodiment, the DRAM devices are DDR SDRAM devices that use an internal, pipelined double-data-rate architecture to achieve high-speed operation. In one embodiment, card edge connector 4 is a 294-pin DIMM style edge connector. In one embodiment, card edge connector 4 includes 147 contact pads disposed on one side of circuit card 2 and 147 pins disposed on the opposite side of circuit card 2.

Continuing with FIG. 1, circuit card 2 has a top surface 22 from which a first opening 5 extends. Opening 6 also extends from top surface 22, forming tab 26. Though openings 5–6 are shown to be roughly L-shaped openings, the present invention is well adapted for use of openings having other shapes. Opening 5 forms tab 25 that extends longitudinally toward the center of memory module 10. Similarly, opening 6 forms tab 26 that extends longitudinally toward the center of memory module 10.

Referring still to FIG. 1, in one embodiment, notch 8 extends from side surface 23 and notch 9 extends from side surface 24. Notch 8 and notch 9 are semicircular openings extending through circuit card 2. However, the present invention is well adapted for notches having other shapes. Alignment Notches 27–29 extend from the lower surface of the circuit card 2 for aligning memory module 10 with socket 11. However, the present invention is adapted for the use of more or fewer alignment notches 27–29 and for the placement of alignment notches 27–29 at other locations within the lower surface of circuit card 2.

Continuing with FIG. 1, guide assembly 70 includes guide 15 and guide 16. Guides 15–16 are attached to circuit board 18 and are disposed on opposite sides of socket 11. In one embodiment, guides 15–16 are formed of plastic. However, the present invention is well adapted for using guides 17 formed of other materials. Guide assembly 70 includes latches 17 that are attached to guide 15 and guide 16. Latches 17 hold memory module 10 securely in place once memory module 10 is fully inserted into guide assembly 70 such that memory module 10 engages socket 11. In addition, latches 17 engage notch 8 and notch 9 for facilitating insertion and removal of memory module 10.

Figure 2:
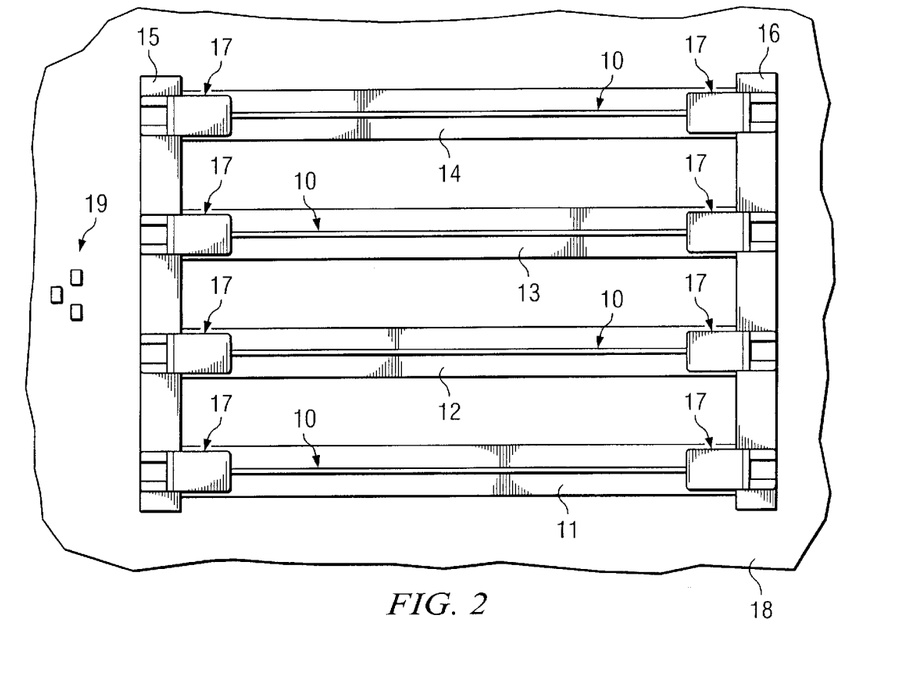
FIG. 2 is a top view showing a memory system that includes four memory modules in accordance with the present claimed invention.

In the embodiment shown in FIG. 2, sockets 11–14 extend between guide 15 and guide 16. Socket 15 includes four latches 17 and socket 16 includes four latches 17 that engage four memory modules 10. Electrical devices 19 are electrically coupled to memory components 3 via sockets 11–14.

Figure 3:
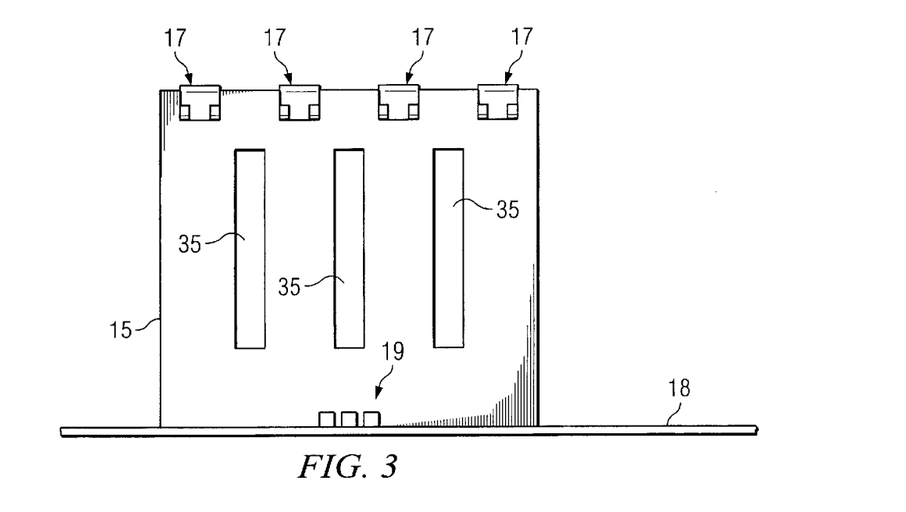
FIG. 3 is side view of a memory system that includes four memory modules in accordance with the present claimed invention.
Figure 4:
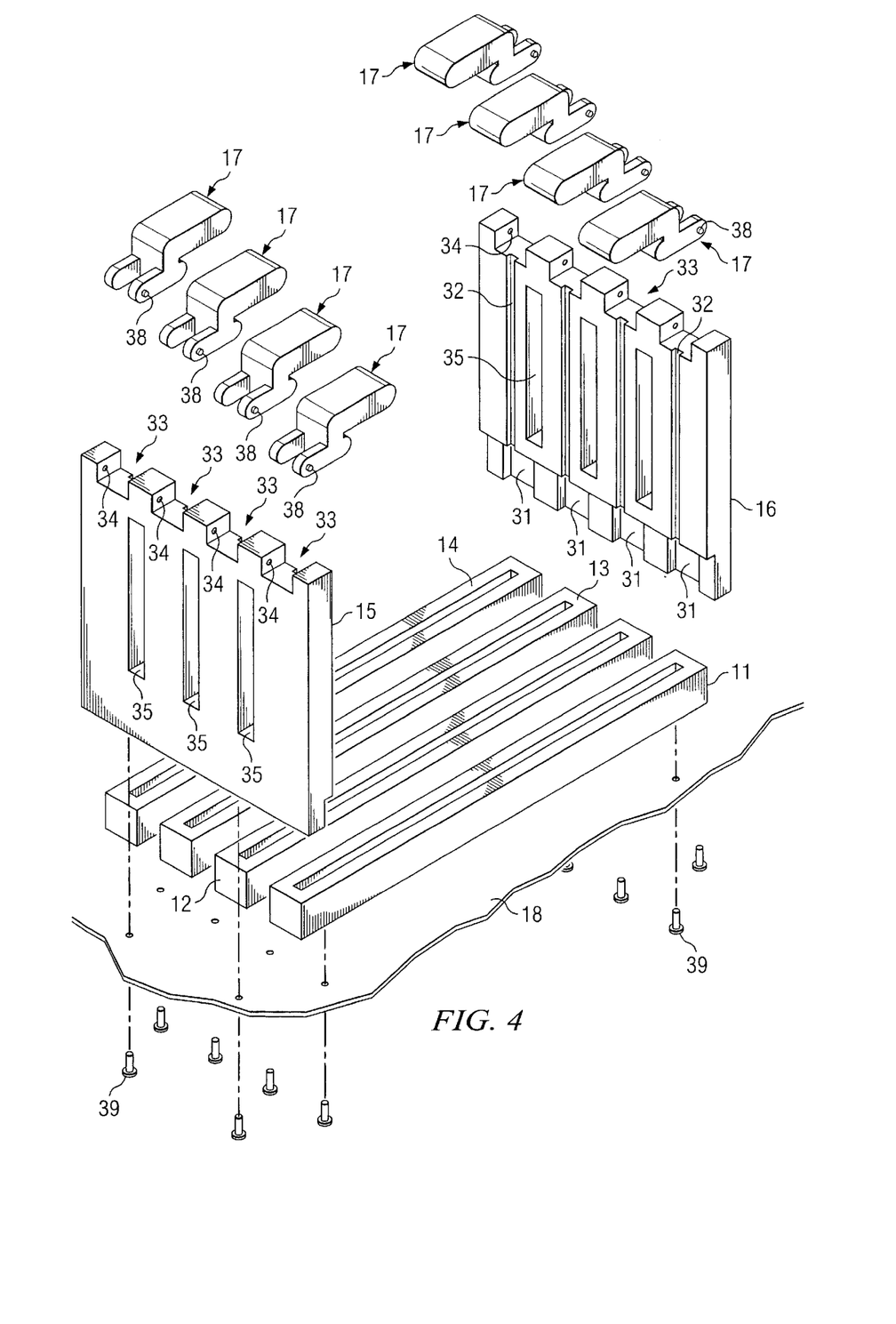
FIG. 4 is an exploded view of a memory system that is adapted to receive four memory modules in accordance with the present claimed invention.
Figure 5:
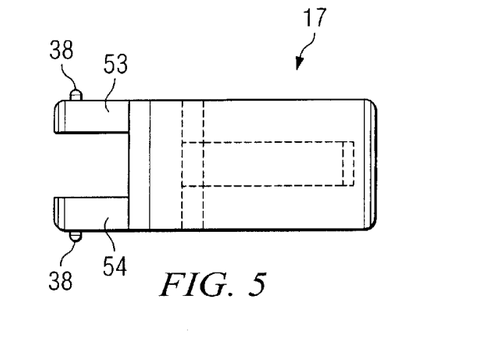
FIG. 5 is a diagram showing a top view of a latch in accordance with the present claimed invention.
Figure 6:
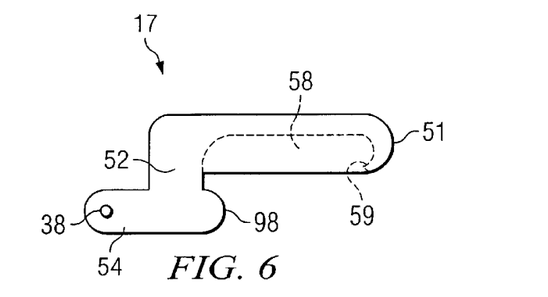
FIG. 6 is a diagram showing a side view of a latch in accordance with the present claimed invention.
Figure 7:
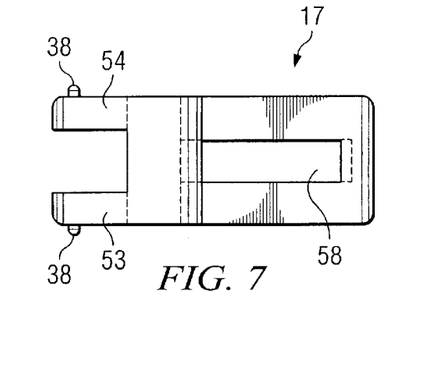
FIG. 7 is a diagram showing a bottom view of a latch in accordance with the present claimed invention.
Figure 8:
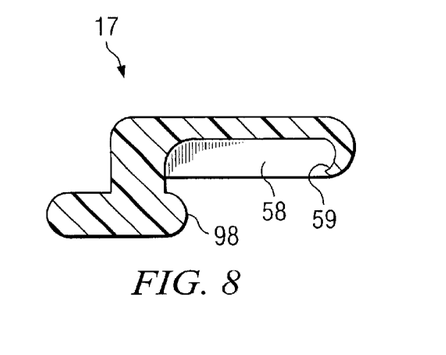
FIG. 8 is a diagram showing a side cut-away view of a latch in accordance with the present claimed invention.

Referring now to FIGS. 3–4, slots 35 extend through guide 15 and guide 16. In the present embodiment, slots 35 are rectangular and extend vertically through guides 15–16. Slots 35 allow air to circulate through guides 15–16 for cooling memory modules 10.

In the embodiment shown in FIG. 4, sockets 11–14 are secured to circuit board 18 by screws 39. Similarly, guides 15–16 are secured to circuit board 18 by screws 39. However, the present invention is well adapted for use of other mechanisms for securing guides 15–16 and sockets 11–14 to circuit board 18. In one embodiment, guides 15–16 are secured to circuit board 18 using either screws or snap-features and sockets 11–14 are secured to circuit board 18 by soldering.

Still referring to FIG. 4, slots 32 extend partially within one side of each of guides 15–16. In one embodiment, each of guides 15–16 includes four slots 32. In the present embodiment, each of slots 32 extend vertically below ones of notches 33. Indentations 31 are formed within the lower portion of guides 15–16 for receiving sockets 11–14. Slots 32 are adapted to receive memory modules 10 of FIGS. 1–2 for holding memory modules 10 securely in place. Indentations 31 are aligned with slots 32 so as to properly align memory modules 10 of FIGS. 1–2 with sockets 11–14.

Continuing with FIG. 4, notches 33 extend from the top surface of guide 15 and guide 16 for receiving latches 17. In one embodiment, the sidewalls formed by each of notches 33 include openings 34 that extend inward in a direction perpendicular to the sidewalls formed by each of notches 33. Pins 38 that extend from each side of latches 17 are adapted to engage openings 34 for securing latches 17 to guides 15–16. Pins 38 engage openings 34 such that latches 17 rotate within a predetermined range. In one embodiment, latches 17 and guides 15–16 are formed of plastic. However, the present invention is well adapted for latches 17 and guides 15–16 that are formed of other materials.

In the embodiment shown in FIGS. 5–8 an exemplary latch 17 is shown that includes a horizontal portion 51, a vertical portion 52. Flanges 53–54 extend from one side of vertical portion 52 and protrusion 98 extends from the opposite side of vertical portion 52. A pin 38 extends from the side surface of flange 53 and pin 38 extends from the side surface of flange 54. A slot 58 extends from the bottom side of horizontal portion 51. In the present embodiment, the end of slot 58, shown as slot end 59, is angled. However, the present invention is well adapted for use of other mechanisms for rotatably coupling latch 17 to guides 15–16.

Figure 9:
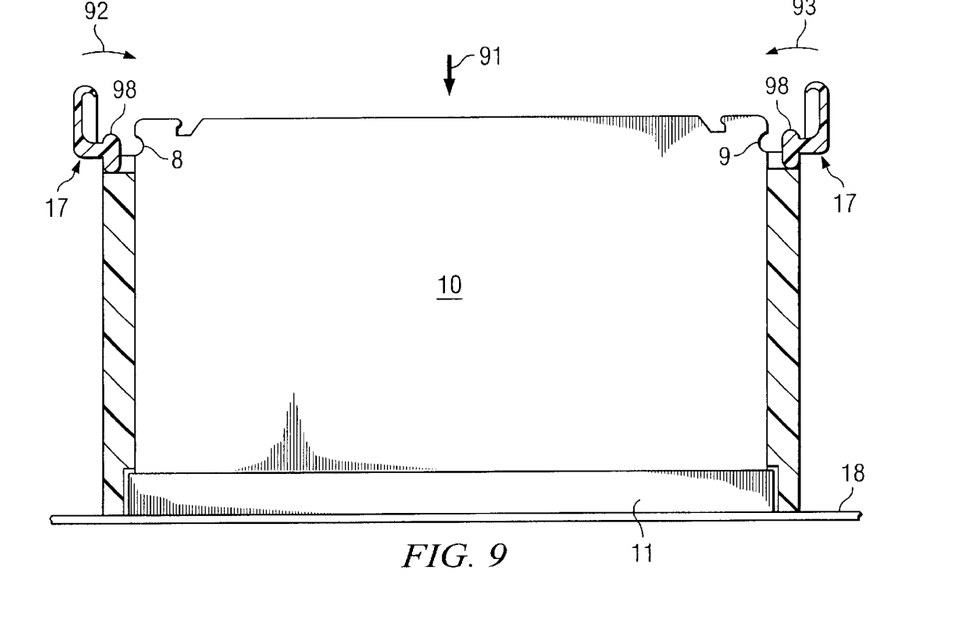
FIG. 9 is diagram showing a memory system that includes latches that are in the open position in accordance with the present claimed invention.
Figure 10:
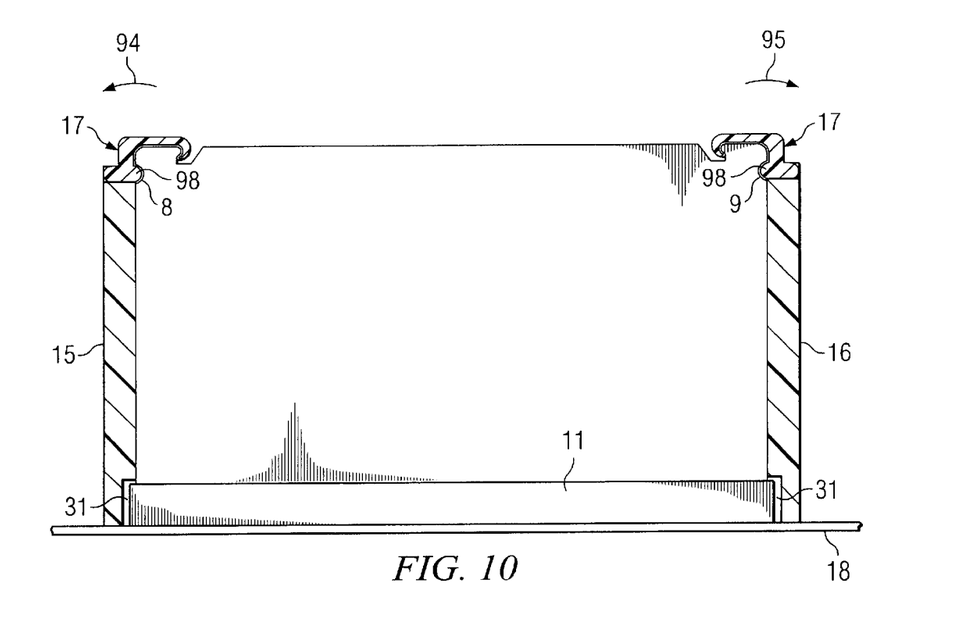
FIG. 10 is a diagram showing a cross-sectional view of a memory system that includes latches that are in the latched position in accordance with the present claimed invention.

In operation, as shown in FIG. 9, a memory module 10 is inserted as shown by arrow 91. Latches 17 on each end of memory module 10 are then moved inward and downward as shown by arrows 92–93. The downward movement of latches 17 causes projections 98 to exert a downward force on circuit card 2 at each of notches 8–9. This downward force moves circuit card 2 into the fully inserted position as is shown in FIG. 10. In the latched position, latches 17 engage tabs 25–26. More particularly, slot ends 59 shown in FIG. 8 engage tabs 25–26 so as to latch memory module 10 securely in place. The use of a slot end 59 that is angled allows for tab 25 and tab 26 to be engaged within slot 58 such that circuit card 2 is securely held in place. The force applied by projections 98 as latches 17 are moved into the latched position provides the necessary mechanical advantage to insert card edge connector 4 into socket 11. This allows for the easy insertion of longer memory modules without resulting in damage to the memory module 10, the socket 11 or the circuit board 18.

As shown in FIG. 10, the operation of latches 17 also facilitates removal of memory module 10. In operation, a memory module 10 is removed by movement of latches 17 as shown by arrows 94–95. This movement first disengages latches 17 from slot end 59, unlatching memory module 10. Further movement of latches 17 causes projections 98 to exert an upward force on circuit card 2 at each of notches 8–9. This moves memory module 10 upward. The upward movement of memory module 10 frees card edge connector 4 from socket 11. Memory module 10 can then easily be removed by grasping memory module 10 at or near the top of memory module 10.

Figure 11:
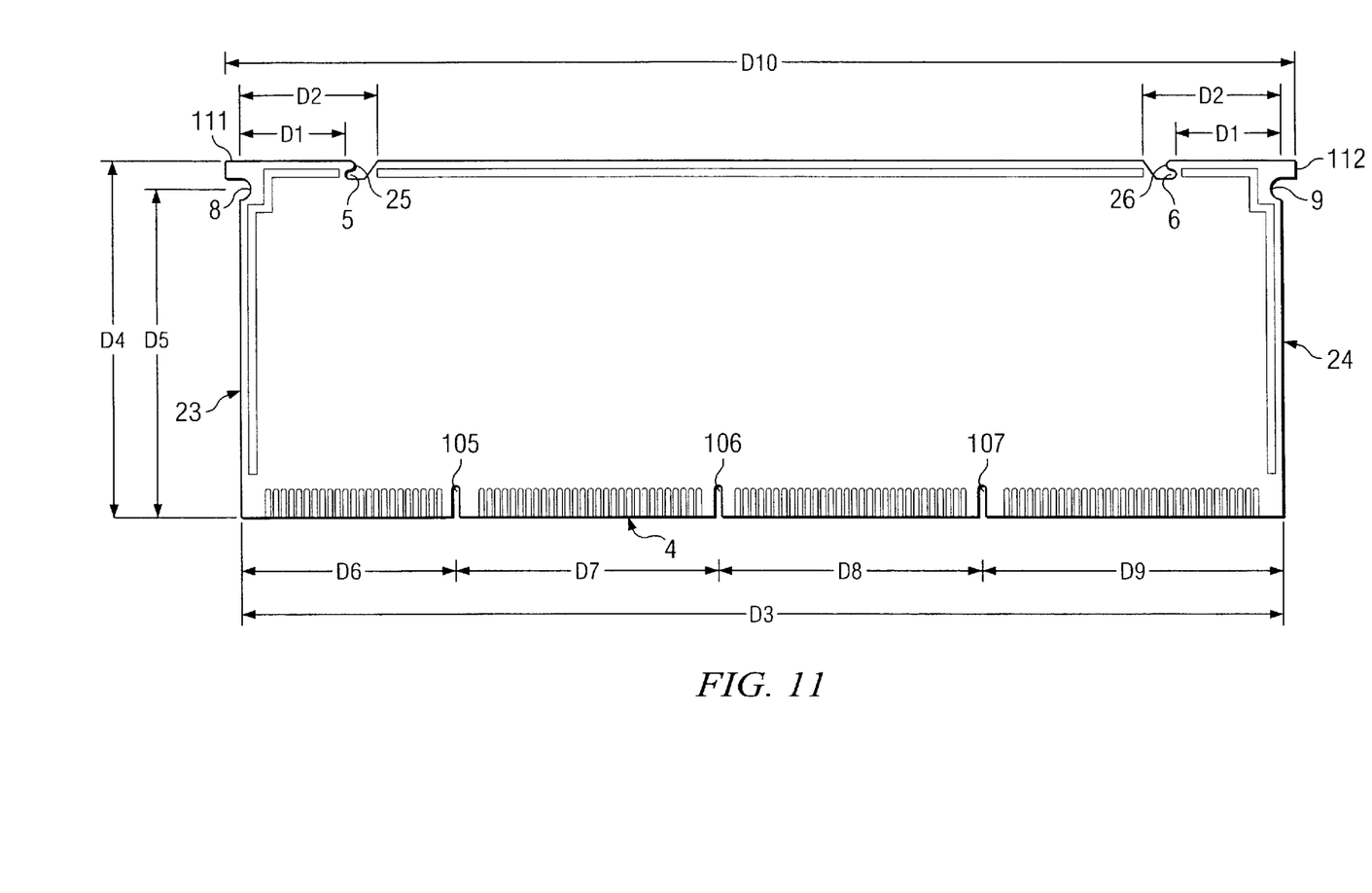
FIG. 11 is a diagram showing a circuit card in accordance with one embodiment of the present claimed invention.

FIG. 11 shows a specific embodiment that includes a circuit card 2 that has dimensions D1–D9. In this embodiment, D1 is the distance between the side surfaces of circuit card 2 and the outer side of openings 5 and 6. In the present embodiment, D1 is approximately 19.61 millimeters. D2 is the distance to the inner side of opening 5 and 6. In the present embodiment, D2 is approximately 25.4 millimeters. In one embodiment, tab 25 extends from approximately 18 millimeters to approximately 22 millimeters from side surface 23 of circuit card 2 and tab 26 extends from approximately 18 millimeters to approximately 22 millimeters from side surface 24.

Continuing with FIG. 11, the total height is shown as D4 and distance D5 between notch 8 and the bottom side surface of circuit card 2 is shown as D5. The distance between notch 9 and the bottom side surface of circuit card 2 is also shown as D5. In the present embodiment, distance D4 is approximately 63.5 millimeters D5 is approximately 57.5 millimeters. In one embodiment, notches 8–9 have a radius of 1.75 millimeters. In the present embodiment, the distance between side surfaces 23–24 is distance D3 that is approximately 176 millimeters. The center of notch 105 is separated from side surface 23 of circuit card 2 by distance D6 that is approximately 37.5 millimeters. The center of notch 106 is separated from the center of notch 105 by distance D7 that is approximately 44 millimeters and the center of notch 107 is separated from the center of notch 106 by distance D8 that is approximately 39 millimeters. This gives a distance between notch 107 and the right side surface of circuit card 2, shown as D9, of 55.5 millimeters. Extending regions 111–112 extend laterally relative to side surfaces 23–24 by a distance of approximately 3 millimeters, giving a distance D10 of 182 millimeters.

Continuing with FIG. 11, the present invention allows for the use of memory modules that are tall. In one embodiment, memory module 10 has a height D4 of 63.5 millimeters. In one embodiment, memory module 10 has a height of between 62 millimeters and 80 millimeters. However, the present invention is well adapted for the use of memory modules having other heights.

Continuing with FIG. 11, the present invention also allows for the use of memory modules that are longer than conventional prior art memory modules. In one embodiment, memory module 10 has a primary length of 176 millimeters. In another embodiment, memory module 10 has a primary length of between 167 millimeters and 177 millimeters. The term primary length refers to the distance between side surface 23 and side surface 24 and does not include the length of extending regions 111–112.

The apparatus of the present invention allows for the easy insertion and extraction of memory modules that are long and that are tall. By using guides on each end of each memory module that include latches, force is applied on each end for inserting and removing memory modules. This provides mechanical advantage that is necessary for properly inserting and removing the tall and long memory modules 10 of the present invention.

The apparatus of the present invention prevents damage to circuit boards, sockets, and memory modules by allowing for easy access to the latching mechanism. That is, latches 17 of FIGS. 1–9 are located near the top of guides 15–16 and extend over memory module 10. Thus, latches 17 are easily reached for inserting and removing memory module 10. Thus, there is no need to reach around each memory module as is required by prior art devices, preventing accidental contact with a memory module.

The memory modules of the present invention are less expensive to manufacture and result in lower manufacturing defect rates as compared to prior art memory modules that include levers mounted on the memory module itself. This reduced manufacturing cost and reduction in defect rate results from the elimination of the lever mounted on the memory module itself. In addition, the memory modules of the present invention can have higher density of memory components and higher memory capacity as compared to prior art memory modules that include a lever mounted on the memory module itself. This advantages results from the additional space provided by not including a lever mounted on the memory module itself.

For the above reasons, the present invention provides a system and apparatus that is inexpensive and easy to operate. The present invention provides a system and apparatus that allows for the use of high capacity memory modules and is less likely to be damaged than prior art systems. The present system includes memory modules that are less expensive to manufacture and that have a lower defect rate as compared with prior art memory modules that include an ejection lever located on one side of the circuit card.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A memory module comprising:
   a circuit card having a top surface and a first side surface and a second side surface, said top surface of said circuit card having a first opening forming a first tab and a second opening forming a second tab, said first side surface having a first notch disposed therein and separated from the top surface and said second side surface having a second notch disposed therein, said first notch and said first opening operable to receive a first latch of a frame for securing said memory module, said second notch and said second opening operable to receive a second latch of said frame for securing said memory module;
   a card edge connector; and
   a plurality of memory components electrically coupled to said card edge connector.

2. A memory module as recited in claim 1 wherein said card edge connector is a 294 pin connector.

3. A memory module as recited in claim 1 wherein said first opening and said second opening are L-shaped.

4. A memory module as recited in claim 1 wherein said first notch and said second notch have a semicircular shape.

5. A memory module as recited in claim 1 wherein said first notch and said second notch are disposed near said top surface of said circuit card.

6. A memory module as recited in claim 1 wherein said first tab is disposed near said first side surface and said second tab is disposed near said second side surface.

7. A memory module as recited in claim 1 wherein said memory module has a height of between 62 millimeters and 80 millimeters.

8. A memory module as recited in claim 1 wherein said memory module has a length of between 167 millimeters and 177 millimeters.

9. A memory module as recited in claim 1 wherein a distance between said first side surface and said first tab is from approximately 18 millimeters to approximately 22 millimeters.

10. A guide assembly for a computer system that includes a circuit board and a plurality of sockets for receiving memory modules comprising:
   a first guide disposed proximate to one end of said plurality of sockets, said first guide including a plurality of slots adapted to receive said memory modules;
   a second guide disposed proximate to an opposite end of said plurality of sockets, said second guide including a plurality of slots adapted to receive said memory modules; and
   a plurality of latches pivotally coupled to said first guide and said second guide and disposed above said plurality of slots such that each of said plurality of latches is operable to pivot in the main plane of the circuit board to engage an opening located in a top surface and separated from the top surface of one of said memory modules and a notch on a side surface of said one of said memory modules for holding said one of said memory modules securely in place, said plurality of latches adapted to engage side surfaces of said memory modules for facilitating insertion and removal of said memory modules.

11. A guide assembly as recited in claim 10 wherein said first guide and said second guide include a plurality of indentations adapted to receive sockets.

12. A guide assembly as recited in claim 10 wherein said first guide and said second guide and said plurality of latches comprise plastic.

13. A guide assembly as recited in claim 10 wherein each of said plurality of latches includes a horizontal portion having a bottom surface and wherein said slot is disposed in said bottom surface of said horizontal portion.

14. A guide assembly as recited in claim 13 wherein each of said plurality of latches includes a vertical portion and wherein a projection extends from said vertical portion, said projection adapted to engage notches in said memory modules for facilitating insertion and removal of said memory modules.

15. A guide assembly as recited in claim 10 wherein each of said plurality of latches includes a slot that has an angled end surface.

16. A guide assembly as recited in claim 15 wherein a plurality of slots are disposed in a top of said first guide and said second guide, said plurality of slots adapted to receive said plurality of latches.

17. A guide assembly as recited in claim 15 wherein each of said plurality of slots disposed in said top of said first guide and said second guide includes a first sidewall and a second sidewall, and wherein a first opening is formed in each first sidewall and a second opening is formed in each second sidewall, each of said plurality of latches having a first pin and a second pin extending therefrom, said first pin engaging said first opening and said second pin engaging said second opening.

18. A guide assembly as recited in claim 17 wherein each of said plurality of latches includes a first flange and a second flange that extend from a vertical portion, said first pin extending from said first flange and said second pin extending from said second flange.

19. A memory system comprising:
   a circuit board;
   a plurality of sockets coupled to said circuit board;
   a memory module including a circuit card having a top surface and a first side surface and a second side surface, said memory module including a card edge connector adapted to electrically couple said memory module to ones of said plurality of sockets, said top surface of said circuit card having a first opening forming a first tab and a second opening forming a second tab, said first side surface having a first notch disposed therein and separated from the top surface and said second side surface having a second notch disposed therein and separated from the top surface;
   a first guide disposed proximate to one end of said plurality of sockets, said first guide including a plurality of slots adapted to receive said memory module;
   a second guide disposed proximate to an opposite end of said plurality of sockets, said second guide including a plurality of slots adapted to receive said memory module; and
   a first latch and a second latch pivotally coupled to said first guide and said second guide and disposed above said plurality of slots, said first notch and said first opening operable to receive said first latch, pivoted in the main plane of the circuit board for securing said memory module, said second notch and said second opening operable to receive, said second latch for securing said memory module, said first latch and said second latch adapted to engage said first notch and said second notch for facilitating insertion and removal of said memory module.

20. The memory system of claim 19 wherein said first opening and said second opening are L-shaped openings.

21. A method for coupling a memory module to a circuit board having a plurality of sockets disposed thereon, said method comprising:
   providing a first guide coupled to said circuit board, said first guide disposed proximate to one end of said plurality of sockets, said first guide including a plurality of slots each adapted to receive said memory module;
   providing a second guide coupled to said circuit board, said second guide disposed proximate to an opposite end of said plurality of sockets, said second guide including a plurality of slots each adapted to receive said memory module;
   providing a first latch and a second latch pivotally coupled to said first guide and said second guide and disposed above said plurality of slots;
   inserting said memory module into one of said plurality of slots associated with said first latch and said second latch; and
   rotating said first latch and said second latch, which are both so as to engage a first notch and a second notch which are both located on opposite sides of said memory module and separated from its top surface and to engage a first opening and a second opening on said top surface of said memory module for holding said memory module securely in place.

22. A method for coupling a memory module to a circuit board as recited in claim 21 wherein said memory module further includes a circuit card having a first side surface and a second side surface, said first side surface having a first notch disposed therein and said second side surface having a second notch disposed therein, said first notch operable to receive said first latch for securing said memory module, said second notch opening operable to receive said second latch for securing said memory module.

23. A method for coupling a memory module to a circuit board as recited in claim 22 wherein said memory module further includes a circuit card having said top surface with said first opening forming a first tab and said second opening forming said second tab, said step of rotating said first latch and said second latch including engaging said first opening of said first tab and said second opening of said second tab to latch said memory module securely in place.

* * * * *